United States Patent
Takeuchi et al.

(10) Patent No.: US 8,178,283 B2
(45) Date of Patent: May 15, 2012

(54) METHOD OF TREATING RINSING WASTEWATER FROM DEVELOPING APPARATUS FOR PHOTOSENSITIVE LITHOGRAPHIC PRINTING PLATE, METHOD OF DEVELOPMENT, AND DEVELOPING APPARATUS

(75) Inventors: Jun Takeuchi, Saitama (JP); Hitoshi Tsuru, Kasuga (JP); Yukihiro Yamakoshi, Tokyo (JP)

(73) Assignee: Eastman Kodak Company, Rochester, NY (US)

( * ) Notice: Subject to any disclaimer, the term of this patent is extended or adjusted under 35 U.S.C. 154(b) by 252 days.

(21) Appl. No.: 12/516,884

(22) PCT Filed: Dec. 5, 2007

(86) PCT No.: PCT/JP2007/073902
§ 371 (c)(1),
(2), (4) Date: May 29, 2009

(87) PCT Pub. No.: WO2008/075587
PCT Pub. Date: Jun. 26, 2008

(65) Prior Publication Data
US 2010/0047718 A1    Feb. 25, 2010

(30) Foreign Application Priority Data
Dec. 18, 2006  (JP) .................. 2006-340312

(51) Int. Cl.
G03F 7/00    (2006.01)
G03F 7/26    (2006.01)
G03C 1/00    (2006.01)
B41F 7/00    (2006.01)
B41N 1/00    (2006.01)

(52) U.S. Cl. ...... 430/309; 430/302; 101/453; 101/463.1
(58) Field of Classification Search ................. 430/302; 101/450.1; 134/2, 3, 24
See application file for complete search history.

(56) References Cited

U.S. PATENT DOCUMENTS

| | | | | | |
|---|---|---|---|---|---|
| 2,882,154 | A | * | 4/1959 | Cohn | 430/159 |
| 3,627,685 | A | * | 12/1971 | Lam | 510/171 |
| 4,504,406 | A | * | 3/1985 | Dhillon | 510/171 |
| 5,759,743 | A | * | 6/1998 | Muramoto et al. | 430/309 |
| 6,063,554 | A | * | 5/2000 | Kitteridge | 430/432 |
| 6,365,330 | B1 | * | 4/2002 | Leichsenring et al. | 430/331 |
| 2006/0154187 | A1 | * | 7/2006 | Wilson et al. | 430/331 |

FOREIGN PATENT DOCUMENTS

| | | | |
|---|---|---|---|
| EP | 1354720 A2 | * | 10/2003 |
| JP | 05 150408 | | 6/1993 |
| JP | 05150408 | * | 6/1993 |
| JP | 2000-084600 | | 3/2000 |
| JP | 2001-038367 | | 2/2001 |
| JP | 2001038367 A | * | 2/2001 |
| JP | 2004-249182 | | 9/2004 |
| JP | 2004249182 A | * | 9/2004 |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

An object of the present invention is to provide a simple method for treatment of a washing waste liquid, which enhances the flocculation effect and also enhances filtration characteristics of a flocculated washing waste liquid in a flocculation treatment of a washing waste liquid generated in processing a photosensitive lithographic printing plate.

Disclosed is a method for treatment of a washing waste liquid generated in a processing apparatus of a photosensitive lithographic printing plate, which comprises (1) adding a cationic polymer flocculant to the washing waste liquid, then (2) adding an anionic polymer floccculent, followed by (3) filtration.

3 Claims, 1 Drawing Sheet

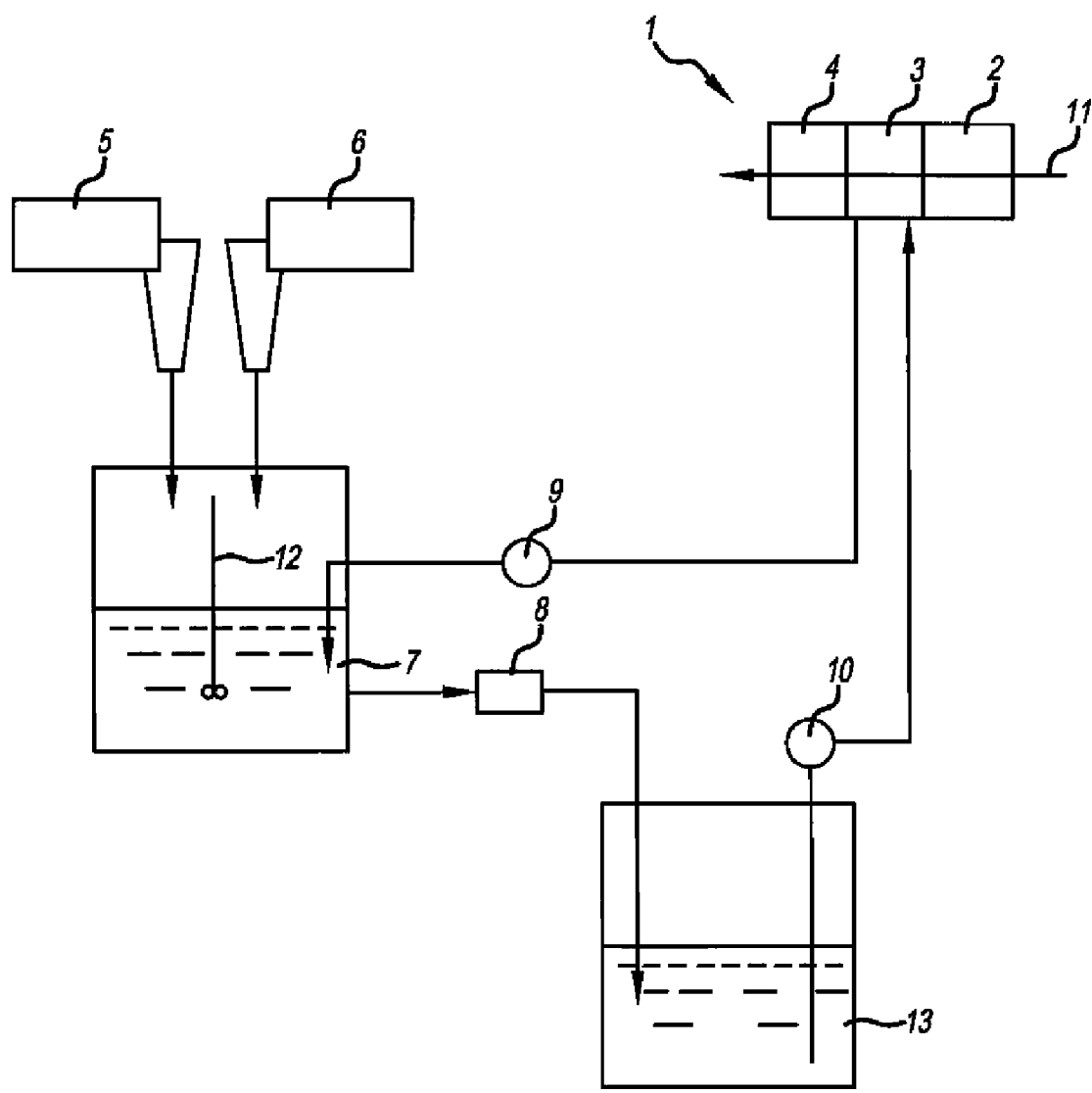

METHOD OF TREATING RINSING WASTEWATER FROM DEVELOPING APPARATUS FOR PHOTOSENSITIVE LITHOGRAPHIC PRINTING PLATE, METHOD OF DEVELOPMENT, AND DEVELOPING APPARATUS

TECHNICAL FIELD

The present invention relates to a method for treatment of a washing waste liquid exhausted by a washing unit of an automatic processing apparatus of a photosensitive lithographic printing plate, particularly a CTP (computer-to-plate) plate. The present invention also relates to a processing method comprising the step of treating a washing waste liquid, and a processing apparatus.

BACKGROUND ART

Japanese Unexamined Patent Publication (Kokai) No. 2003-035959 discloses a method for treatment of a developing waste liquid of a negative photosensitive lithographic printing plate. This publication proposes that an inorganic flocculant and an organic polymer compound-based flocculant are used alone or in combination so as to treat a washing waste liquid.

Japanese Unexamined Patent Publication (Kokai) No. 06-27683 discloses a method for processing a non-silver salt photosensitive material using an automatic processor. This publication proposes a combination of flocculation treatment and filtration as one means for separating a washing waste water into a solute and water. The flocculation treatment is conducted by adding a neutralizing agent and/or a flocculant to the washing waste water. As the flocculent, an inorganic flocculant or an organic flocculant has been proposed.

Japanese Unexamined Patent Publication (Kokai) No. 04-334589 discloses a method for treatment of an exhausted washing liquid of a non-silver salt photosensitive material. This publication proposes that a filter aid and a neutralizing agent are used as flocculation means so as to treat the exhausted washing liquid.

Japanese Unexamined Patent Publication (Kokai) No. 04-353847 discloses a method for treatment of an exhausted washing liquid of a non-silver salt photosensitive material. This publication proposes that a two-stage filtration method is used after using a filter aid and a neutralizing agent as flocculation means.

Japanese Unexamined Patent Publication (Kokai) No. 07-020636 discloses a method for treatment of an exhausted washing liquid of a non-silver salt photosensitive material. This publication proposes that a two-stage filtration method is used after using a filter aid and a neutralizing agent as flocculation means, and that the filtrate is transferred to a second flocculation step or a third filtration step.

Japanese Unexamined Patent Publication (Kokai) No. 04-322784 discloses a method for treatment of a washing waste liquid of a photosensitive material. This publication proposes that the washing waste liquid is treated by a first flocculation step, a neutralization step and a second flocculation step. An inorganic flocculant is used in the first flocculation step, while a cationic polymer flocculant is used in the second flocculation step.

Japanese Unexamined Patent Publication (Kokai) No. 05-005998 discloses a method for treatment of a circulating washing liquid of a photosensitive lithographic printing plate. This publication proposes that the circulating washing liquid is subjected to a neutralization flocculation treatment. In the neutralization flocculation treatment, at least one treatment of addition of a neutralizing agent, addition of a filter aid and addition of a flocculant is used. In this publication, the flocculant is not specifically described.

These conventional flocculation methods are not suited for practical use since it is difficult to remove the precipitate produced after adding the flocculant through filtration because of tackiness and adhesion of the precipitate, and a long period of time is required in the case of gravity-flow filtration and also a high-degree separation apparatus, such as treatment by centrifugal filtration, press filtration or ultra filtration is required.

DISCLOSURE OF THE INVENTION

An object of the present invention is to provide a simple method for treatment of a washing waste liquid, which enhances the flocculation effect and also enhances filtration characteristics of a flocculated washing waste liquid in a flocculation treatment of a dissolved material or a colloidal material in a washing waste liquid generated in processing a photosensitive lithographic printing plate.

Another object of the present invention is to provide a method for processing a photosensitive lithographic printing plate in which a flocculated washing waste liquid can be reused by returning to a washing step after development.

Further, another object of the present invention is to provide an apparatus for processing a photosensitive lithographic printing plate in which a flocculated washing waste liquid can be reused by returning to a washing step.

The present invention pertains to a method for treatment of a washing waste liquid generated in a processing apparatus of a photosensitive lithographic printing plate, which comprises:
(1) adding a cationic polymer flocculant to the washing waste liquid, then
(2) adding an anionic polymer flocculant, followed by
(3) filtration the liquid.

The present invention also pertains to a method for processing a photosensitive lithographic printing plate, which comprises the steps of developing a photosensitive lithographic printing plate, washing the developed photosensitive lithographic printing plate and finishing the washed photosensitive lithographic printing plate, wherein
 a washing waste liquid treated by the method for treatment described above is reused in the washing step.

The present invention also pertains to an apparatus for processing a photosensitive lithographic printing plate, comprising a developing unit, a washing unit and a finishing unit, wherein
 the washing unit further comprises a washing waste liquid treating unit including a tank for a cationic polymer flocculant, a tank for an anionic polymer flocculant, a flocculation tank, a filtration portion and a treated washing water storage tank.

In the present invention, a contaminant can be separated from a washing waste liquid in a short time using a very simple separation apparatus in which two types of flocculants are filtered after adding to a flocculation tank. The method for treatment of the present invention does not require pH adjustment or an acid treatment as a pretreatment.

According to the present invention, it is also possible to decrease the amount of a washing liquid and to lengthen lifetime by reusing a highly treated washing waste liquid through returning to a washing step of a processing apparatus. The treated washing waste liquid is free from a dissolved contaminant and contamination of a washing roller or a spray pipe in the processing apparatus can decrease, thus facilitating maintenance.

The present invention can also provide an apparatus for processing a photosensitive lithographic printing plate comprising a very simple washing waste liquid treating unit.

BRIEF DESCRIPTION OF THE DRAWINGS

FIG. 1 is a schematic view showing a processing apparatus using a flocculation method of the present invention.

BEST MODE FOR CARRYING OUT THE INVENTION

The washing waste water to be treated using the method of the present invention is discharged from a washing unit disposed behind a developing unit in an apparatus for processing a photosensitive lithographic printing plate.

The photosensitive lithographic printing plate according to the present invention is particularly a photosensitive lithographic printing plate for a CTP system, and typically a photosensitive lithographic printing plate comprised of a photosensitive layer containing an alkali soluble resin and an infrared absorber in which solubility in a developing solution increases by heat, a photosensitive lithographic printing plate in which a condensation crosslinking reaction is caused by a heat treatment after exposure in the presence of an acid generated under exposure as a catalyst and then a photosensitive layer at the exposed area is cured to form an image, or a photosensitive lithographic printing plate in which a material capable of generating a radical under light or heat is introduced into a photosensitive layer, a polymerization reaction is caused by radical generated under exposure as an initiator and then a photosensitive layer at the exposed area is cured to form an image.

Examples of the photosensitive lithographic printing plate include a thermal positive photosensitive lithographic printing plate, a thermal negative photosensitive lithographic printing plate and a photopolymer photosensitive lithographic printing plate.

For example, the thermal positive photosensitive lithographic printing plate is comprised of a positive photosensitive layer in which solubility of the infrared laser irradiated area in a developing solution increases by heat. The thermal negative photosensitive lithographic printing plate is comprised of a negative photosensitive layer in which the infrared laser irradiated area is cured to form an image area. One of these thermal negative photosensitive layers can be a polymerization type layer. This polymerization type layer contains an infrared absorber, a radical generator (radical polymerization initiator), a radical polymerizable compound capable of curing by causing a polymerization reaction through a generated radical, and a polymer binder.

The photopolymer photosensitive layer contains a photopolymerizable photosensitive composition, a photopolymerization initiator and a polymer binder as essential components and optionally contains various compounds such as a colorant, a plasticizer and a thermal polymerization inhibitor.

The photosensitive lithographic printing plate is developed after writing an image using laser light. Examples of the developing solution used in the development include water or an aqueous alkali developing solution.

As the aqueous alkali developing solution, an aqueous alkali developing solution with the pH value of 12 or higher is usually used. Examples of an alkaline agent used in the developing solution include inorganic alkali compounds such as sodium silicate, potassium silicate, potassium hydroxide, sodium hydroxide, lithium hydroxide, a sodium, a potassium or an ammonium salt of dibasic phosphoric acid or tribasic phosphoric acid, sodium metasilicate, sodium carbonate and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine and ethylenediamine.

For example, organic solvents such as benzyl alcohol, ethyl acetate and butyl acetate can be added in the developing solution. Furthermore, water-soluble sulfites, hydroxyaromatic compounds, water softeners, various surfactants and various deformers can be optionally added in the developing solution.

The washing waste liquid to be discharged from the washing unit disposed behind the developing unit contains the dissolved material or the colloidal material of the photosensitive layer of the photosensitive lithographic printing plate, and the developing solution carried over from the developing unit mixed therein. In the present invention, this washing waste liquid is treated by (1) adding a cationic polymer flocculant in the washing waste liquid, then (2) adding an anionic polymer flocculant, followed by (3) filtrating the liquid.

The term "cationic polymer flocculant" used herein refers to a polymer flocculant derived from a monomer having a cationic group. The term "anionic polymer flocculant" used herein refers to a polymer flocculant derived from a monomer having an anionic group.

Examples of the cationic polymer flocculant, which can be used in the present invention include, polyaminomethylacrylamide, polyvinylimidazoline, polyaminoalkyl(meth)acrylate, halogenated polyvinyl pyridium, halogenated polydimethyldiallyl ammonium, and an ionene-based compound. Of these cationic polymer flocculants, a strong cationic polymer flocculant having high degree of cationicity is particularly preferable. The degree of cationicity refers to mol % of a cationic moiety of a polymer flocculant comprised of a cationic moiety and an anionic moiety and is represented by the following equation:

$$\text{Degree of cationicity(mol \%)} = \{y/(x+y)\} \times 100$$

where y denotes the number of moles of a cationic moiety in the structural formula of a polymer flocculant and x denotes the number of moles of an anionic moiety.

A cation with the degree of cationicity of 100 to 60 mol % is referred to as a strong cation, a cation with the degree of cationicity of 60 to 30 mol % is referred to as a medium cation, and a cation with the degree of cationicity of 30 mol % or less is referred to as a weak cation.

Specific examples of preferable strong cationic polymer flocculants include Sunfloc™ 700, Sunfloc C-009P, Sunfloc CH-109P and Sunfloc CE-6860P (all of which are manufactured by Sanyo Chemical Industries, Ltd.); ACCOFLOC C488, ACCOFLOC C498L, ACCOFLOC C577 and ACCOFLOC C591 (all of which are manufactured by Mitsui Chemicals AquaPolymer, Inc.); and Nisshinfloc C1048L, Nisshinfloc C850M and Nisshinfloc C740 (all of which are manufactured by Nisshin Sangyo Co. Ltd.).

Examples of the anionic polymer flocculant, which can be used in the present invention, include sodium polyacrylate, (or an acrylamide-sodium acrylate copolymer), a polyacrylamide partial hydrolyzate and sulfomethylated polyacrylamide.

Specific examples of the preferable anionic polymer flocculent include Sunfloc™ AH-200P, Sunfloc AH-400P, Sunfloc AS-110P and Sunfloc AM-170P (all of which are manufactured by Sanyo Chemical Industries, Ltd.); ACCOFLOC A95H, ACCOFLOC A120, ACCOFLOC A150, ACCOFLOC A190 and ACCOFLOC A240 (all of which are manufactured by Mitsui Chemicals AquaPolymer, Inc.); and Nisshinfloc A55M, Nisshinfloc A73MU and Nisshinfloc A95M(all of which are manufactured by Nisshin Sangyo Co. Ltd.).

The amount of the cationic polymer flocculant to be added in the washing waste liquid varies depending on the degree of contamination of the washing waste water, and is preferably from 0.01 to 10% by weight based on the amount of the washing waste liquid.

The amount of the anionic polymer flocculant to be added may be smaller than that of the cationic polymer flocculant, and is preferably from 0.05 to 10 parts by weight, and more preferably from 0.1 to 5 parts by weight, based on 100 parts by weight of the amount of the cationic polymer flocculant.

In the method for treatment of the present invention, it is not necessary to add a pH adjustor or an acid treating agent, which is conventionally used, before adding a flocculent in the treatment of a developing solution or a washing waste liquid.

After the flocculation treatment, the washing waste liquid is filtered. When the flocculation treatment is conducted by the method of the present invention, the flocculated floc produced thereby is in the form of large particles, and thus a simple and easy method using gravitational sedimentation or filtering can be used for filtration. Although a more high-degree centrifugal filtration, ultrafiltration or precise filtration method can also be used, it is not necessary to use the method after the flocculation treatment of the present invention. The filtration method is particularly preferably a filter filtration method.

In the flocculation treatment, defoamers, water stain-preventing agents and preservatives may be added in the flocculation treatment.

In the automatic processing apparatus of the photosensitive lithographic printing plate, timing of the treatment of the washing waste liquid varies depending on the replenishment amount of the washing liquid, the number of the photosensitive lithographic printing plates to be treated, and the operation time. While monitoring the pH value and the concentration of the contaminant, the treatment is preferably conducted when these values exceeded fixed reference values. During operation of the automatic processing apparatus, the washing waste water treatment of the present invention can also be carried out.

The contaminant is completely removed from the treated liquid obtained by carrying out the washing waste water treatment of the present invention, and the treated liquid has a pH value of 7 to 12 after filtration. Therefore, the treated liquid can be reused as it is in the washing unit by returning into the washing tank. Consequently, the amount of the washing liquid and the final amount of the waste water can be decreased.

An example of the apparatus for carrying out the method of the present invention will now be described with reference to the accompanying drawing.

FIG. 1 is a schematic view showing an automatic processing apparatus 1 for carrying out the method for treatment of a washing waste liquid of the present invention. Although the inner structure of the automatic processing apparatus is briefly shown, the automatic processing apparatus is comprised of a developing tank 2, a washing tank 3 and a gum tank 4. The arrow 11 indicates the direction in which a photosensitive lithographic printing plate moves in the automatic processing apparatus. First, the photosensitive lithographic printing plate enters into the developing tank 2, where a photosensitive layer as the non-image area is removed, and then enters into the washing tank 3 of a washing unit. In the washing unit, the plate is washed by spraying a washing liquid over the plate surface. Then, the washed printing plate is transferred to the gum tank 4 of a finishing unit.

The waste liquid of the washing liquid used in the washing unit is transferred to a flocculation tank 7 using a pump 9. A cationic polymer flocculant is put into a flocculant tank 5, while an anionic polymer flocculant is put into a flocculant tank 6. When the liquid level of the flocculation tank 7 reaches to predetermined height, a predetermined amount of the cationic polymer flocculant is introduced from the tank 5. After slowly stirring the waste liquid using a stirrer 12, a predetermined amount of the anionic polymer flocculant is introduced from the tank 6. After slowly stirring furthermore, the waste liquid is transferred to a filter 8, where the waste liquid is filtered. The filtrate is reused by returning to the washing tank 3 using a pump 10. A treated washing liquid storage tank in which the filtrate is once stored is provided between the filter 8 and the pump 10.

As described above, the apparatus for carrying out the washing waste liquid treatment of the present invention can have a simple configuration comprised of two flocculant tanks, a flocculation tank and a filter portion, and can be easily incorporated into the automatic processing apparatus.

While the treatment of a washing waste liquid was described, a developing waste liquid can also be treated in the same manner and can be reused after treating the developing waste liquid alone or a mixture of the developing waste liquid and the washing waste liquid in the same manner.

EXAMPLES

The present invention will now be described in more detail by way of examples.

As a photosensitive lithographic printing plate for carrying out the method for treatment of a washing waste liquid of the present invention, thermal positive type photosensitive lithographic printing plates TP-R and TP-W (both of which are trade names, manufactured by Kodak Polychrome Graphics Japan Ltd.) were prepared. These photosensitive lithographic printing plates are CTP plates comprising a photosensitive layer containing a novolak resin and an infrared absorber as main components formed on an electrically roughened aluminum substrate. Imagewise exposure of these photosensitive lithographic printing plates was conducted using a plate setter PT-R4300 manufactured by Dainippon Screen MFG. Co., Ltd.

These exposed photosensitive lithographic printing plates were developed using an automatic processor PK-910II (manufactured by Kodak Polychrome Graphics Japan Ltd.) as the automatic processor. The internal configuration of this automatic processor was roughly the same as that shown in FIG. 1.

As the development in the automatic processor PK-910II, first, development is conducted using a developing solution PD1 (manufactured by Kodak Polychrome Graphics Japan Ltd.) diluted at a ratio of 1:8. The developed printing plates are transferred to a washing unit, where they are washed. Then, these printing plates were subjected to a finishing treatment using a finishing gum PF2 (manufactured by Kodak Polychrome Graphics Japan Ltd.) diluted at a ratio of 1:1.5. During the treatment of these lithographic printing plates, developability and gum protectability were maintained by adding a defined replenishment amount of a PDIR dilute solution diluted at a ratio of 1:3 as a developing solution replenisher and a PF2 solution diluted at a ratio of 1:1.5 as a finishing gum replenisher.

Using this automatic processor PK-910II, 150 exposed photosensitive lithographic printing plates (measuring 0.24× 1030×800 mm) were treated per day under normal treatment conditions (pH: 12.5 to 13.0).
(Formulation of Flocculant of Tank 5)
Cationic polymer flocculant:
Undiluted Sunfloc 700 (50% solution, manufactured by Sanyo Chemical industries, Ltd.)
(Formulation of Flocculant of Tank 6)
Anionic polymer flocculant:

| | |
|---|---|
| Non-diluted Sunfloc AH-200P (manufactured by Sanyo Chemical industries, Ltd.) | 0.05% |
| Water | 99.95% |

As a filtration filter, Micro Cilia 25-EX-50 and 250L-EX-100 manufactured by Roki Techno Co., Ltd. were used.

Example 1

Example of the Invention

20 L of a washing waste liquid from the washing unit of an automatic processor was charged into a flocculation tank 7. From a flocculant tank 5, 200 g of undiluted Sunfloc 700 was added in the flocculation tank 7. After slowly stirring, 400 g of a solution in a flocculent tank 6 was added in the flocculation tank 7. Then, filtration was carried out using Micro Cillia 25-EX-50 as the filter. The washing water (pH=10.2) thus treated was stored in a washing water storage tank.

Example 2

Example of the Invention

20 L of a washing waste liquid from the washing unit of an automatic processor was charged into a flocculation tank 7. From a flocculant tank 5, 200 g of undiluted Sunfloc 700 was added in the flocculation tank 7. After slowly stirring, 50 g of a solution in a flocculant tank 6 was added in the flocculation tank 7. Then, filtration was carried out using Micro Cillia 25-EX-50 as the filter. The washing water (pH=10.5) thus treated was stored in a washing water storage tank.

Example 3

Example of the Invention

20 L of a washing waste liquid from the washing unit of an automatic processor was charged into a flocculation tank 7. From a flocculant tank 5, 200 g of undiluted Sunfloc 700 was added in the flocculation tank 7. After slowly stirring, 1,500 g of a solution in a flocculant tank 6 was added in the flocculation tank 7. Then, filtration was carried out using Micro Cillia 25-EX-50 as the filter. The washing water (pH=9.0) thus treated was stored in a washing water storage tank.

For comparison, a test was conducted with respect to the case where only a cationic flocculent was added (Comparative Example 1) and the case where only an anionic flocculant was added (Comparative Example 2).

The evaluation results are shown in Table 1 below. The state of a floc and the state of washing water of the washing water storage tank were visually evaluated.

TABLE 1

| | Flocculant | State of floc | Sedimentation rate | State of washing water in storage tank after flocculation treatment |
|---|---|---|---|---|
| Example 1 | Cationic flocculant and anionic flocculant | Large particle | Fast | Transparent |
| Example 2 | Cationic flocculant and anionic flocculant | Large particle | Fast | Transparent |
| Example 3 | Cationic flocculant and anionic flocculant | Large particle | Fast | Transparent |
| Comparative Example 1 | Only cationic flocculant | Medium particle | Fast | Color of treated waste liquid became light color |
| Comparative Example 2 | Only anionic flocculant | None | Not sedimented | Not changed after treatment |

As is apparent from the results shown in Table 1, in Examples 1 to 3, the flocculation rate in the flocculation tank was fast and the floc could be removed using a commercially available filter, and treated washing waste became transparent after the treatment. In Comparative Example 1, flocculation occurred, but the floc was difficult to remove using a commercially available filter. In Comparative Example 2, flocculation did not occur and the state of the washing tank did not change, and the color is dark blue. This shows that the washing waste liquid is not purified in the comparative examples.

Example 4

In this example, it is confirmed that an alkali resin of a photosensitive layer of a photosensitive lithographic printing plate is completely removed by the flocculation method of the present invention after flocculation.

As the photosensitive lithographic printing plate, a photosensitive lithographic printing plate for CTP, TP-W (trade name, manufactured by Kodak Polychrome Graphics Japan Ltd.) was prepared. In the same manner as in Examples 1 to 3, this imagewise exposed printing plate (1,061 m$^2$) was developed using a developing solution PD1 (manufactured by Kodak Polychrome Graphics Japan Ltd.) diluted at a ratio of 1:8 and then washed to obtain a washing waste liquid. 200 ml of this washing waste liquid was charged in two containers A and B. In one container A, Sunfloc 700 (cationic flocculant) was added in an amount of 0.5% by weight based on the washing waste liquid, and then an aqueous 0.05% solution of Sunfloc AH-2000P (anionic flocculant) was added in an amount of 2% by weight based on the washing waste liquid. Then, this washing waste was separated into a filtrate and solid matter using a filter paper. The washing waste liquid in the container B was maintained as it is.

An aqueous sulfuric acid (aqueous 10% solution) was added to container A encasing the filtrate and container B encasing the untreated washing waste liquid, respectively. It has already been found that an alkali soluble resin or a dye can be completely removed by adding an acid to the washing waste liquid. A precipitate was produced in the container B, while neither a precipitate nor a dispersion was produced in the container A. This shows that the alkali soluble resin is completely separated and removed by the flocculation method of the present invention. It was surprising that the alkali soluble resin could be completely separated and removed only by using a cationic flocculent and an anionic flocculant in accordance with the treating method of the present invention without performing pH adjustment or an acid treatment as a pretreatment. The amount of the solid matter such as an alkali soluble resin filtered and separated after flocculation of the washing waste liquid in the container A was about 0.09 g.

The invention claimed is:

1. A method for treatment of a used washing waste liquid generated in a processing apparatus during processing of a radiation exposed and developed photosensitive lithographic printing plate comprising a positive-working photosensitive layer comprising an alkali soluble resin and an infrared absorber, which method consists essentially of:
    adding a cationic polymer flocculant to the used washing waste liquid, then
    adding an anionic polymer flocculant to the used washing waste liquid, followed by
    filtration of the used washing waste liquid containing the resulting flocculated materials, and
    wherein the alkali soluble resin is a novolak resin.

2. The method for treatment according to claim 1, wherein the anionic polymer flocculant is added to the used washing waste liquid in an amount of 0.05 to 10 parts by weight based on 100 parts by weight of the cationic polymer flocculant.

3. The method for treatment according to claim 2, wherein the anionic polymer flocculant is added to the used washing waste liquid in an amount of 0.1 to 5 parts by weight based on 100 parts by weight of the cationic polymer flocculant.

* * * * *